(12) United States Patent
Paek et al.

(10) Patent No.: US 10,854,844 B2
(45) Date of Patent: Dec. 1, 2020

(54) ORGANIC LIGHT-EMITTING DISPLAY DEVICE

(71) Applicant: LG Display Co., Ltd., Seoul (KR)

(72) Inventors: Seung-Han Paek, Seoul (KR); Joon-Suk Lee, Seoul (KR); Seong-Woo Park, Goyang-si (KR); Saemleenuri Lee, Seoul (KR); Do-Hyung Kim, Seoul (KR); Seung-Won Yoo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/664,326

(22) Filed: Oct. 25, 2019

(65) Prior Publication Data

US 2020/0161583 A1 May 21, 2020

(30) Foreign Application Priority Data

Nov. 16, 2018 (KR) .................. 10-2018-0142065

(51) Int. Cl.
*H01L 29/08* (2006.01)
*H01L 51/52* (2006.01)
*H01L 27/32* (2006.01)

(52) U.S. Cl.
CPC ........ *H01L 51/5253* (2013.01); *H01L 27/322* (2013.01); *H01L 51/525* (2013.01); *H01L 51/5206* (2013.01); *H01L 51/5221* (2013.01)

(58) Field of Classification Search
CPC ............... H01L 51/5253; H01L 27/322; H01L 51/5206; H01L 51/5221; H01L 51/525
USPC .......................................................... 257/40
See application file for complete search history.

(56) References Cited

U.S. PATENT DOCUMENTS

| | | | |
|---|---|---|---|
| 9,773,994 B2* | 9/2017 | Kim ................. | H01L 51/5234 |
| 9,812,667 B2* | 11/2017 | Dighde ............. | H01L 51/0097 |
| 10,090,367 B2* | 10/2018 | Choi ................ | H01L 27/3211 |
| 10,600,994 B2* | 3/2020 | Kang ............... | H01L 51/524 |
| 2013/0161680 A1* | 6/2013 | Oh .................. | H01L 51/5253 257/99 |
| 2016/0028043 A1* | 1/2016 | Kwon .............. | H01L 51/5253 257/40 |
| 2017/0125728 A1* | 5/2017 | Dighde ............ | H01L 51/5253 |

* cited by examiner

*Primary Examiner* — Caleb E Henry
(74) *Attorney, Agent, or Firm* — Fenwick & West LLP

(57) ABSTRACT

An organic light-emitting display device characterized by improved reliability is disclosed. The organic light-emitting display device is configured such that each of an organic encapsulation layer, which is disposed on a light-emitting element, and an upper inorganic encapsulation layer, which is disposed on the organic encapsulation layer, are divided into a plurality of parts. Even when cracks are formed in a subpixel due to an external impact or when external moisture or oxygen permeates into the subpixel, therefore, it is possible to prevent the cracks, the moisture, or the oxygen from diffusing to an adjacent subpixel, whereby the reliability and lifespan of the display device are improved.

20 Claims, 9 Drawing Sheets

144  146

ORGANIC LIGHT-EMITTING DISPLAY DEVICE

CROSS-REFERENCE TO RELATED APPLICATIONS

This application claims the benefit of Republic of Korea Patent Application No. 10-2018-0142065, filed on Nov. 16, 2018, which is hereby incorporated by reference as if fully set forth herein.

BACKGROUND

Field

The present disclosure relates to an organic light-emitting display device, and more particularly to an organic light-emitting display device characterized by improved reliability.

Discussion of the Related Art

Image display devices, which are a core technology in the information and communication age and serve to display various kinds of information on a screen, have been developed such that the image display devices are increasingly thin, lightweight, and portable and exhibit high performance. In addition, organic light-emitting display (OLED) devices, which are more lightweight and have a smaller volume than cathode ray tubes (CRT), have been highlighted. Such organic light-emitting display devices, which are self-emissive display devices, exhibit low power consumption, a high response speed, high light emission efficiency, high luminance, and a wide viewing angle.

A light-emitting element constituting an organic light-emitting display device has low resistance to moisture and thus is easily deteriorated. As a result, the quality and lifespan of the organic light-emitting element are lowered, whereby the reliability of the display device is reduced.

SUMMARY

Accordingly, the present disclosure is directed to an organic light-emitting display device that substantially obviates one or more problems due to the limitations and disadvantages of the related art.

An object of the present disclosure is to provide an organic light-emitting display device characterized by improved reliability.

Additional advantages, objects, and features of the invention will be set forth in part in the description which follows and in part will become apparent to those having ordinary skill in the art upon examination of the following, or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display device is configured such that each of an organic encapsulation layer, which is disposed on a light-emitting element, and an upper inorganic encapsulation layer, which is disposed on the organic encapsulation layer, are divided into a plurality of parts. Even when cracks are formed in a subpixel due to an external impact or when external moisture or oxygen permeates into the subpixel, therefore, it is possible to prevent the cracks, the moisture, or the oxygen from diffusing to an adjacent subpixel, whereby the reliability and lifespan of the display device are improved.

Embodiments also relate to a light-emitting display device. The light-emitting display device includes a substrate, and a plurality of pixels on the substrate. Each pixel may include a light-emitting element. The light-emitting display device may also include an encapsulation unit on the substrate. The encapsulation unit may include a lower inorganic encapsulation layer disposed on the plurality of pixels to encapsulate the plurality of pixels, a plurality of organic encapsulation layers on the lower inorganic encapsulation layer. The plurality of organic encapsulation layers may be spaced apart from one another. The encapsulation unit may also include a plurality of upper inorganic encapsulation layers disposed on the plurality of organic encapsulation layers. The plurality of upper inorganic encapsulation layers may be spaced apart from one another.

Embodiments also relate to a light-emitting display device. The light-emitting display device includes a substrate, and a plurality of pixels on the substrate. Each pixel may include a light-emitting element. The light-emitting display device may also include a plurality of bank layers on the substrate, in which each bank layer is disposed between a corresponding pair of pixels in the plurality of pixels. The light-emitting display device may also include an encapsulation unit on the plurality of pixels. The encapsulation unit may include a lower inorganic encapsulation layer disposed on the plurality of pixels to encapsulate the plurality of pixels, and a plurality of organic encapsulation layers on the lower inorganic encapsulation layer. The plurality of organic encapsulation layers may be spaced apart from one another. The encapsulation unit may also include a plurality of upper inorganic encapsulation layers disposed on the plurality of organic encapsulation layers. Each adjacent pair of upper inorganic encapsulation layers may be spaced apart from one another to form a gap at a location of at least one of the plurality of bank layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the disclosure and together with the description serve to explain the principle of the disclosure. In the drawings.

DETAILED DESCRIPTION

Hereinafter, exemplary embodiments of an organic light-emitting display device according to the present disclosure will be described in detail with reference to the accompanying drawings so that the present disclosure will be easily realized by those skilled in the art.

Figure 1:
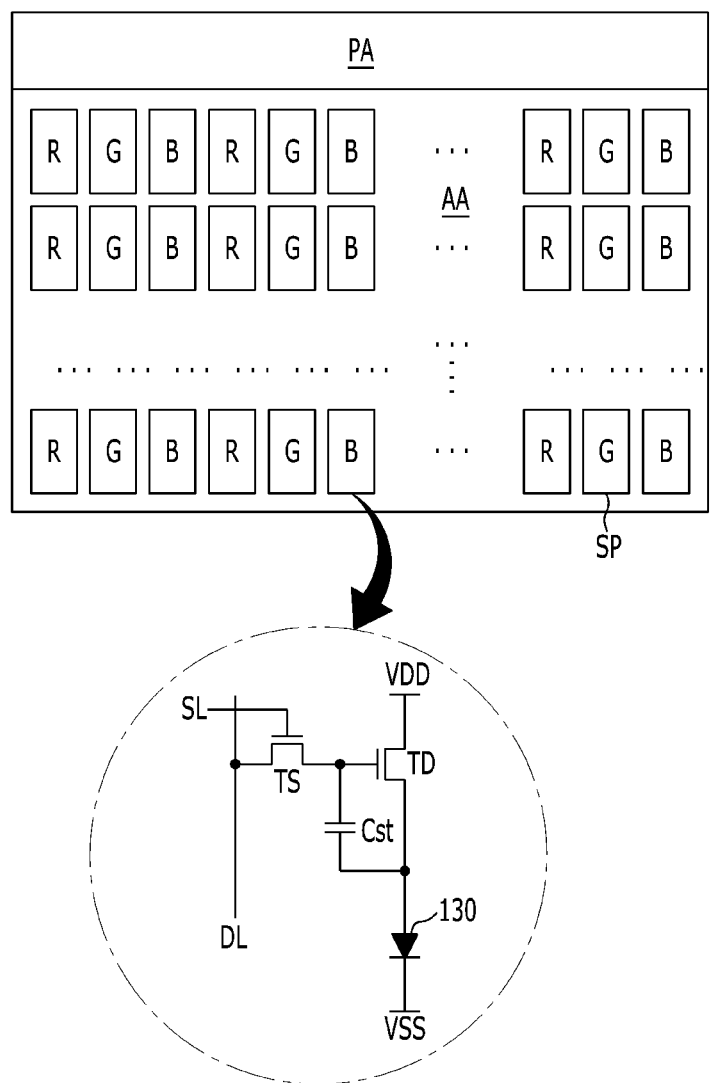
FIG. 1 is a plan view showing a display device according to an embodiment of the present disclosure.
Figure 2:
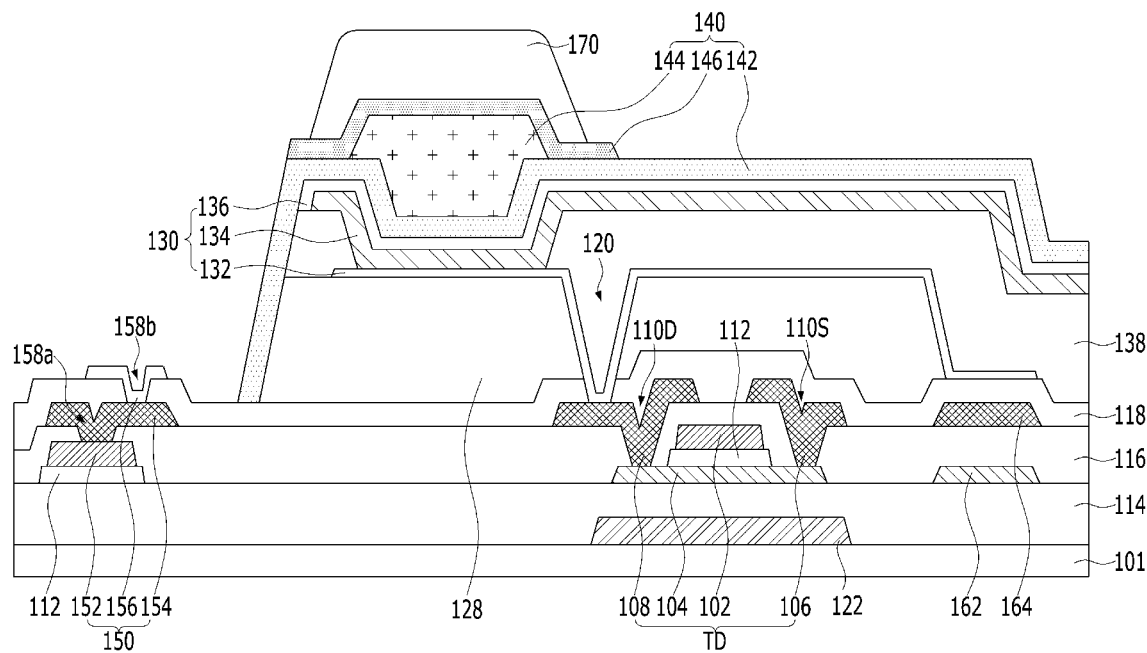
FIG. 2 is a sectional view showing the display device according to an embodiment of the present disclosure.

FIG. 1 is a plan view showing an organic light-emitting display device according to an embodiment of the present disclosure, and FIG. 2 is a sectional view of the organic light-emitting display device shown in FIG. 1 according to an embodiment of the present disclosure.

The organic light-emitting display device shown in FIGS. 1 and 2 includes an active area AA and a pad area PA.

A plurality of pads 150 for supplying driving signals to scan lines SL, data lines DL, high-voltage (VDD) supply lines, and the low-voltage (VSS) supply lines, which are disposed in the active area AA, is formed in the pad area PA.

Each of the pads 150 includes a pad lower electrode 152, a pad middle electrode 154, and a pad upper electrode 156.

The pad lower electrode 152 is formed on a gate dielectric pattern 112, which has the same, similar, or aligned shape as the pad lower electrode 152, and is made of the same material as a gate electrode 102.

The pad middle electrode 154 is formed on an interlayer dielectric film 116, in the same layer as source and drain electrodes 106 and 108, and is made of the same material as the source and drain electrodes 106 and 108. The pad middle electrode 154 is electrically connected to the pad lower electrode 152, which is exposed through a first pad contact hole 158a formed through the interlayer dielectric film 116.

The pad upper electrode 156 is electrically connected to the pad middle electrode 154, which is exposed through a second pad contact hole 158b formed through a passivation film 118. The pad upper electrode 156 is exposed outside so as to contact a circuit transmission film connected to a driving circuit. The pad upper electrode 156, which is formed on the passivation film 118, is made of a metal that exhibits high corrosion resistance and acid resistance, whereby the pad upper electrode 156 is prevented from being corroded by external moisture even when exposed outside. For example, the pad upper electrode 156 has a structure in which an opaque conductive layer (Cu) and a transparent conductive layer (ITO) are stacked.

The active area AA displays an image through unit pixels each including a light-emitting element 130. Thus, a plurality of pixels may be disposed on the substrate, each having a light-emitting element. Each unit pixel includes red (R), green (G), and blue (B) subpixels, or includes red (R), green (G), blue (B), and white (W) subpixels. Each subpixel includes a light-emitting element 130 and a pixel-driving circuit for independently driving the light-emitting element.

The pixel-driving circuit includes a switching transistor TS, a driving transistor TD, and a storage capacitor Cst.

When a scan pulse is supplied to a scan line SL, the switching transistor TS is turned on to supply a data signal, which is supplied to a data line DL, to the storage capacitor Cst and to a gate electrode of the driving transistor TD.

In response to the data signal supplied to the gate electrode 102 of the driving transistor TD, the driving transistor TD controls current I that is supplied from a high-voltage (VDD) supply line to the light-emitting element 130 to adjust the amount of light emitted by the light-emitting element 130. Even when the switching transistor TS is turned off, the driving transistor TD supplies uniform current to the light-emitting element 130 using the voltage charged in the storage capacitor Cst such that the light-emitting element 130 keeps emitting light until a data signal of the next frame is supplied.

To this end, the driving transistor TD includes a gate electrode 102, a source electrode 106, a drain electrode 108, and an active layer 104.

The gate electrode 102 is formed on the gate dielectric pattern 112, which has the same pattern as the gate electrode 102. The gate electrode 102 overlaps a channel area of the active layer 104 in the state in which the gate dielectric pattern 112 is disposed therebetween. The gate electrode 102 may be made of one or an alloy of molybdenum (Mo), aluminum (Al), chrome (Cr), gold (Au), titanium (Ti), nickel (Ni), neodymium (Nd), and copper (Cu), and may have a single-layer structure or a multi-layer structure. However, the present disclosure is not limited thereto. For example, the gate electrode 102 may have a multi-layer structure in which Cu and MoTi are sequentially stacked.

The source electrode 106 is connected to a source area of the active layer 104 through a source contact hole 110S formed through the interlayer dielectric film 116. The drain electrode 108 is connected to a drain area of the active layer 104 through a drain contact hole 110D formed through the interlayer dielectric film 116. In addition, the drain electrode 108 is exposed through a pixel contact hole 120 formed through the passivation film 118 and a planarization layer 128, and is connected to an anode electrode 132.

Each of the source electrode 106 and the drain electrode 108 may be made of, for example, one or an alloy of molybdenum (Mo), aluminum (Al), chrome (Cr), gold (Au), titanium (Ti), nickel (Ni), neodymium (Nd), and copper (Cu), and may have a single-layer structure or a multi-layer structure. However, the present disclosure is not limited thereto.

The active layer 104 is made of at least one of an amorphous semiconductor material, a polycrystalline semiconductor material, or an oxide semiconductor material. A buffer layer 114 and a light-blocking layer 122 are formed between the active layer 104 and a substrate 101. The light-blocking layer 122 is formed on the substrate 101 so as to overlap the active layer 104. The light-blocking layer 122 may absorb or reflect light that is incident from outside to minimize the amount of light that is incident on the channel area of the active layer 104. The light-blocking layer 122 is made of an opaque metal, such as Mo, Ti, Al, Cu, Cr, Co, W, Ta, or Ni.

The buffer layer 114 is formed on the substrate 101, which is made of glass or a plastic resin such as polyimide (PI), and is made of silicon oxide or silicon nitride so as to have a single-layer structure or a multi-layer structure. The buffer layer 114 serves to prevent diffusion of moisture or impurities generated in the substrate 101 or to adjust a heat transfer speed at the time of crystallization such that the active layer 114 is satisfactorily crystallized.

The storage capacitor Cst includes first and second storage capacitors, which are connected to each other in parallel. The first capacitor is formed as the result of a storage lower electrode 162 and a storage upper electrode 164 overlapping in the state in which the interlayer dielectric film 116 is disposed therebetween, and the second capacitor is formed as the result of the anode electrode 132 and the storage upper electrode 164 overlapping in the state in which the passivation film 118 is disposed therebetween. The storage lower electrode 162 is formed in the same layer as the active layer 104, and is made of the same material as the active layer 104. The storage upper electrode 164 is formed as the result of extending from the drain electrode 108. Even when the switching transistor TS is turned off, the driving transistor TD supplies uniform current to the light-emitting element 130 using the voltage charged in the storage capacitor Cst such that the light-emitting element 130 keeps emitting light until a data signal of the next frame is supplied.

The light-emitting element 130 includes an anode electrode 132 connected to a drain electrode 180 of the driving transistor TD, at least one light-emitting stack 134 formed on the anode electrode 132, and a cathode electrode 136 formed on the light-emitting stack 134.

The anode electrode 132 is electrically connected to the drain electrode 108, which is exposed through the pixel contact hole 120 formed through the passivation film 118 and the planarization layer 126. The anode electrode 132 is disposed on the planarization layer 128 so as to be exposed by a bank 138. Thus, the display device may include a plurality of bank layers 138 that each separate a pair of pixels. The bank 138 may be made of an opaque material (for example, black) in order to prevent optical interference between adjacent subpixels. For example, the bank 138 may include a light-blocking material made of at least one of a color pigment, organic black, or carbon.

In the case in which the anode electrode 132 is applied to a top emission type organic light-emitting display device, the anode electrode 132 is configured to have a multi-layer structure including a transparent conductive film and an opaque conductive film having high reflection efficiency. The transparent conductive film is made of a material having a relatively high work function value, such as indium-tin-oxide (ITO) or indium-zinc-oxide (IZO), and the opaque conductive film is configured to have a single-layer or a multi-layer structure including Al, Ag, Cu, Pb, Mo, Ti, or an alloy thereof. For example, the anode electrode 132 is configured to have a structure in which a transparent conductive film, an opaque conductive film, and a transparent conductive film are sequentially stacked. The anode electrode 132 including the opaque conductive film overlaps the pixel-driving circuit, whereby a circuit area in which the pixel-driving circuit is disposed may also be used as a light-emitting area, and therefore the aperture ratio of the display device may be improved.

The at least one light-emitting stack 134 is formed on the anode electrode 132 in the light-emitting area defined by the bank 138. The at least one light-emitting stack 134 is formed by stacking, sequentially or reversely, a hole-related layer, an organic light-emitting layer, and an electron-related layer on the anode electrode 132. In addition, the light-emitting stack 134 may include first and second light-emitting stacks opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellow-green light, whereby white light is generated through the first and second light-emitting stacks. The white light generated by the light-emitting stack 134 is incident on a color filter located above or below the light-emitting stack 134, whereby a color image may be realized. In addition, each light-emitting stack 134 may generate color light corresponding to each subpixel without a separate color filter in order to realize a color image. That is, the light-emitting stack 134 of the red (R) subpixel may generate red light, the light-emitting stack 134 of the green (G) subpixel may generate green light, and the light-emitting stack 134 of the blue (B) subpixel may generate blue light.

The cathode electrode 136 is formed so as to be opposite the anode electrode 132 in the state in which the light-emitting stack 134 is disposed therebetween. In the case in which the cathode electrode 136 is applied to a top emission type organic light-emitting display device, the cathode electrode 136 is made of a transparent conductive film, such as indium-tin-oxide (ITO) or indium-zinc-oxide (IZO).

An encapsulation unit 140 prevents external moisture or oxygen from permeating into the light-emitting element 130, which has low resistance to external moisture or oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is disposed in the uppermost layer. In this case, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the lower and upper inorganic encapsulation layers 142 and 146 will be described by way of example.

The lower inorganic encapsulation layer 142 is formed between the cathode electrode 126 and the organic encapsulation layer 144 so as to be closest to the light-emitting element 130. Thus, the lower inorganic encapsulation layer 142 may be disposed on the plurality of pixels to encapsulate the plurality of pixels. Among the encapsulation layers included in the encapsulation unit 140, the lower inorganic encapsulation layer 142 is disposed so as to be closest to the light-emitting element 130, which has low resistance to moisture or oxygen. As a result, the lower inorganic encapsulation layer 142 has a larger area than the organic encapsulation layer 144 and the upper inorganic encapsulation layer 146. That is, the lower inorganic encapsulation layer 142 may be formed on the entire surface of the active area PA through a deposition process using a metal mask such that the lower inorganic encapsulation layer 142 is not formed in the pad area PA, in which the pads 150 are disposed. The lower inorganic encapsulation layer 142 is made of an inorganic dielectric material that is capable of being deposited at a low temperature, such as silicon nitride (SiNx), silicon oxide (SiOx), silicon oxide nitride (SiON), or aluminum oxide ($Al_2O_3$).

The organic encapsulation layer 144 serves as a buffer for alleviating stress between the respective layers generated due to bending of the organic light-emitting display device, and strengthens a planarization function. The organic encapsulation layer 144 is formed through an inkjet process, and is made of an organic dielectric material, such as an acrylic resin, an epoxy resin, polyimide, polyethylene, or silicon oxycarbide (SiOC).

The upper inorganic encapsulation layer 146 is formed on the substrate 101, on which the organic encapsulation layer 144 is formed, through a deposition process using a metal mask so as to cover the upper surface and the side surface of the organic encapsulation layer 144. That is, the upper inorganic encapsulation layer 146 contacts the lower inorganic encapsulation layer 142 in the state in which the organic encapsulation layer 144 is disposed therebetween. Consequently, the upper inorganic encapsulation layer 146 minimizes or prevents the permeation of external moisture or oxygen into the lower inorganic encapsulation layer 142 and the organic encapsulation layer 144. The upper inorganic encapsulation layer 146 is made of an inorganic dielectric material, such as silicon nitride (SiNx), silicon oxide (SiOx), silicon oxide nitride (SiON), or aluminum oxide ($Al_2O_3$). For example, each of the upper inorganic encapsulation layer 146 and the lower inorganic encapsulation layer 142 is made of SiNx having little or no hydrogen content in order to prevent hydrogen particles from diffusing to the thin film transistors TS and TD. Meanwhile, a second lower inorganic encapsulation layer (not shown), made of SiON, may be disposed between the lower inorganic encapsulation layer 142 and the organic encapsulation layer 144 in order to increase the force of adhesion between the lower inorganic encapsulation layer 142 and the organic encapsulation layer 144. Since the second lower inorganic encapsulation layer has higher hydrogen content than the lower inorganic encapsulation layer 142, the second lower inorganic encapsulation layer is formed so as to have a smaller thickness than the lower inorganic encapsulation layer 142 in order to minimize the diffusion of hydrogen to the active layers 104 of the thin film transistors TD and TS.

Figure 3:
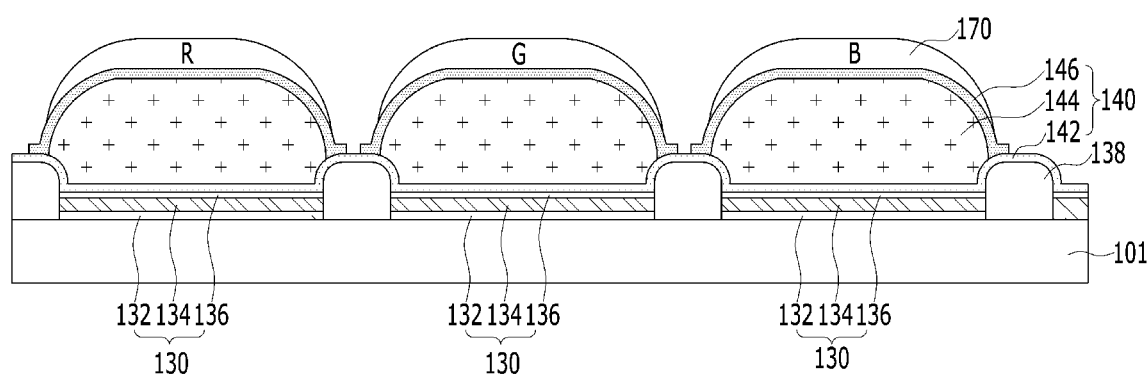
FIG. 3 is a sectional view showing, in detail, an organic encapsulation layer and an upper inorganic encapsulation layer of an encapsulation unit shown in FIG. 2 according to an embodiment of the present disclosure.

As shown in FIG. 3, the organic encapsulation layer 144 and the upper inorganic encapsulation layer 146, which is the uppermost layer of the inorganic encapsulation layers 142 and 146, overlap the anode electrode 132, and are spaced apart from each other in the state in which the bank 138 is disposed therebetween. Each organic encapsulation layer 144 may overlap with a portion of the anode electrode 132 for a corresponding pixel. The organic encapsulation layer 144 for a pixel may also overlap with a portion of the organic light-emitting layer 134 and a portion of the cathode electrode 136 for the pixel. That is, the organic encapsulation layer 144 and the upper inorganic encapsulation layer 146, which is disposed on the organic encapsulation layer, are divided into a plurality of parts so as to be formed in an insular shape. For example, the organic encapsulation layer 144 and the upper inorganic encapsulation layer 146 are formed so as to have one of the structures shown in FIGS. 4A to 4E. For example, a plurality of organic encapsulation layers 144 may be disposed on the lower inorganic encapsulation layer 142, in which the plurality of organic encapsulation layers 144 are spaced apart from one another. A plurality of upper inorganic encapsulation layers 146 may be disposed on the plurality of organic encapsulation layers 144, and may be spaced apart from one another. In one instance, each adjacent pair of upper inorganic encapsulation layers 146 are spaced apart from one another to form a gap at a location of at least one of the plurality of bank layers 138.

Figure 4A:
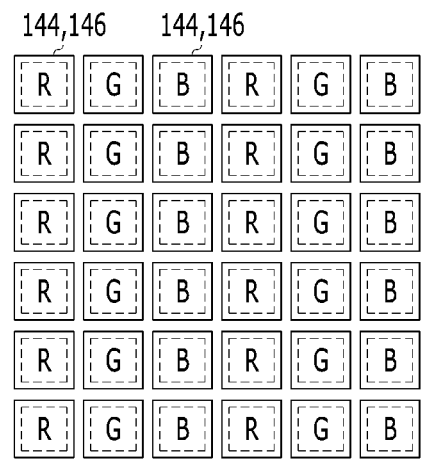
FIGS. 4A to 4E are plan views showing various embodiments of the organic encapsulation layer and the upper inorganic encapsulation layer shown in FIG. 3.
Figure 4B:
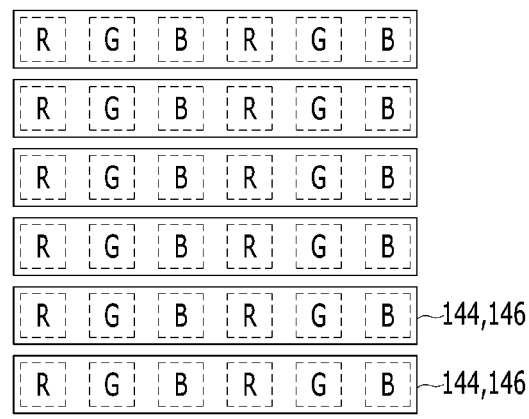
Figure 4C:
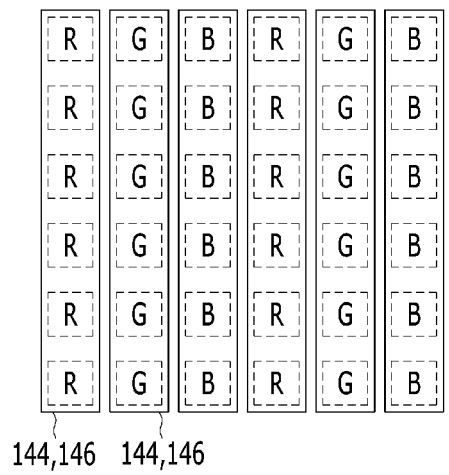
Figure 4D:
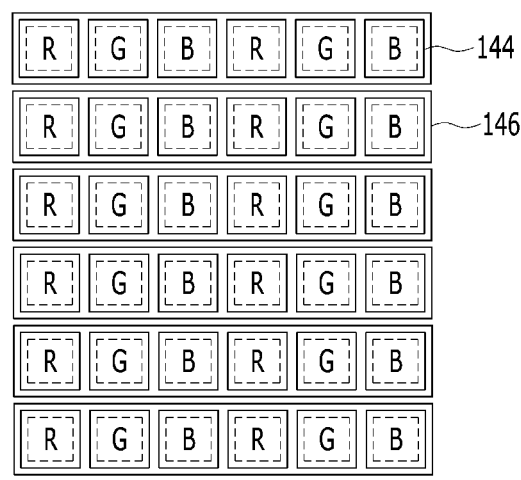
Figure 4E:
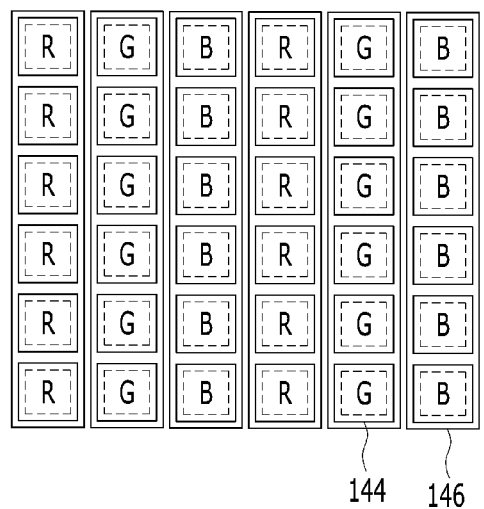

Each of the organic encapsulation layer 144 and the upper inorganic encapsulation layer 146 shown in FIG. 4A is formed so as to independently overlap each other for each subpixel in order to correspond to a color filter 170 in a one-to-one manner. Thus, each organic encapsulation layer 144 and upper inorganic encapsulation layer 146 is disposed on a corresponding one of the plurality of pixels, and each upper inorganic encapsulation layer 146 is disposed on a corresponding one of the plurality of organic encapsulation layers 144. In one embodiment, each organic encapsulation layer 144 is disposed on two or more pixels of the plurality of pixels. For example, each of the organic encapsulation layer 144 and the upper inorganic encapsulation layer 146 shown in FIG. 4B is formed in the shape of a stripe extending in a first direction so as to overlap a plurality of subpixels arranged in the first direction. Thus, each of the organic encapsulation layer 144 and the upper inorganic encapsulation layer 146 may both extend in the first direction to cover a row of pixels. Each of the organic encapsulation layer 144 and the upper inorganic encapsulation layer 146 shown in FIG. 4C is formed in the shape of a stripe extending in a second direction so as to overlap a plurality of subpixels arranged in the second direction. Thus, each of the organic encapsulation layer 144 and the upper inorganic encapsulation layer 146 may both extend in the second direction to cover a column of pixels. In one embodiment, each upper inorganic encapsulation layer 146 may be disposed on two or more corresponding organic encapsulation layers 144. For example, the organic encapsulation layer 144 shown in FIG. 4D is formed so as to overlap each subpixel, and the upper inorganic encapsulation layer 146 shown in FIG. 4D is formed in the shape of a stripe extending in the first direction so as to overlap a plurality of subpixels arranged in the first direction. Thus, two or more organic encapsulation layers 144 may be disposed across a row of pixels arranged in the first direction, and an upper inorganic encapsulation layer 146 for the two or more organic encapsulation layers 144 may extend in the first direction to cover the two or more organic encapsulation layers. As another example, the organic encapsulation layer 144 shown in FIG. 4E is formed so as to overlap each subpixel, and the upper inorganic encapsulation layer 146 shown in FIG. 4E is formed in the shape of a stripe extending in the second direction so as to overlap a plurality of subpixels arranged in the second direction. Thus, two or more organic encapsulation layers 144 may be disposed across a column of pixels arranged in the second directions, and an upper inorganic encapsulation layer 146 for the two or more organic encapsulation layers 144 may extend in the second direction to cover the two or more organic encapsulation layers. In this case, the organic encapsulation layer 144 and the upper inorganic encapsulation layer 146 shown in FIGS. 4A to 4C correspond to each other in a one-to-one manner, and the organic encapsulation layer 144 and the upper inorganic encapsulation layer 146 shown in FIGS. 4D and 4E correspond to each other in a one-to-many manner.

In the present disclosure, therefore, even when cracks or seams are formed in each of the organic encapsulation layer 144 and the upper inorganic encapsulation layer 146 of a specific subpixel due to foreign bodies or bending, it is possible to prevent the cracks or the seams from diffusing to an adjacent subpixel. Also, in the present disclosure, even when moisture, oxygen, or a developing solution used to form the color filter 170 permeates into the subpixel in which cracks or seams are formed, the moisture, oxygen, or developing solution is prevented from diffusing to an adjacent subpixel, whereby the overall reliability and lifespan of the panel are improved.

Figure 5:
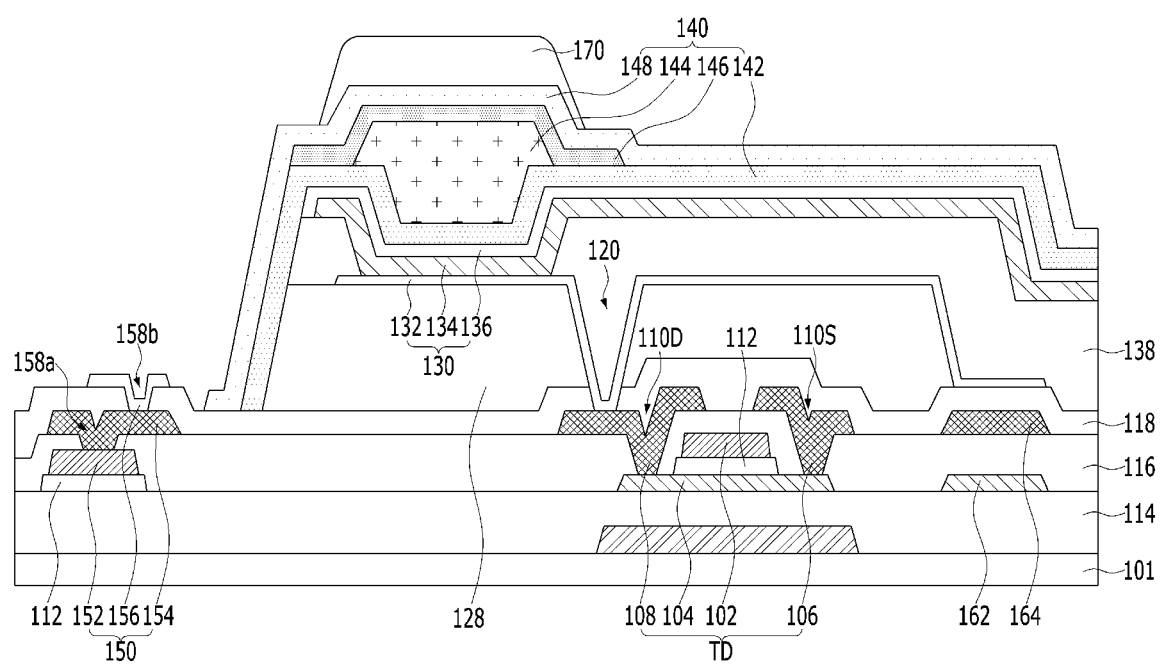
FIG. 5 is a sectional view showing a display device according to another embodiment of the present disclosure.

FIG. 5 is a sectional view showing a display device according to a second embodiment of the present disclosure.

The display device shown in FIG. 5 is identical in construction to the display device shown in FIG. 2, except that a second upper inorganic encapsulation layer 148 is further included, and therefore a detailed description of the same elements will be omitted for the sake of brevity.

The second upper inorganic encapsulation layer 148 is formed so as to have a line width equal or similar to the line width of the lower inorganic encapsulation layer 142. That is, the second upper inorganic encapsulation layer 148 has a larger area than the first upper inorganic encapsulation layer 146. To this end, the second upper inorganic encapsulation layer 148 is formed in the active area AA, excluding the pad area PA, through a deposition process using a metal mask, in the same manner as in the lower inorganic encapsulation layer 142.

The second upper inorganic encapsulation layer 148 is formed on the lower inorganic encapsulation layer 142, which is exposed by the first upper inorganic encapsulation layer 146. Consequently, the second upper inorganic encapsulation layer 148 prevents the lower inorganic encapsulation layer 142 from being damaged by foreign bodies, whereby it is possible to prevent cracks from being formed in the lower inorganic encapsulation layer 142.

The second upper inorganic encapsulation layer 148 is made of an inorganic dielectric material, such as silicon nitride (SiNx), silicon oxide (SiOx), silicon oxide nitride (SiON), or aluminum oxide ($Al_2O_3$). For example, the first upper inorganic encapsulation layer 146 is made of silicon oxide nitride (SiON) having high force of adhesion with the organic encapsulation layer 144, and the second upper inorganic encapsulation layer 148 is made of SiNx having little or no hydrogen content in order to prevent hydrogen particles from diffusing to the thin film transistors TS and TD.

Figure 6A:
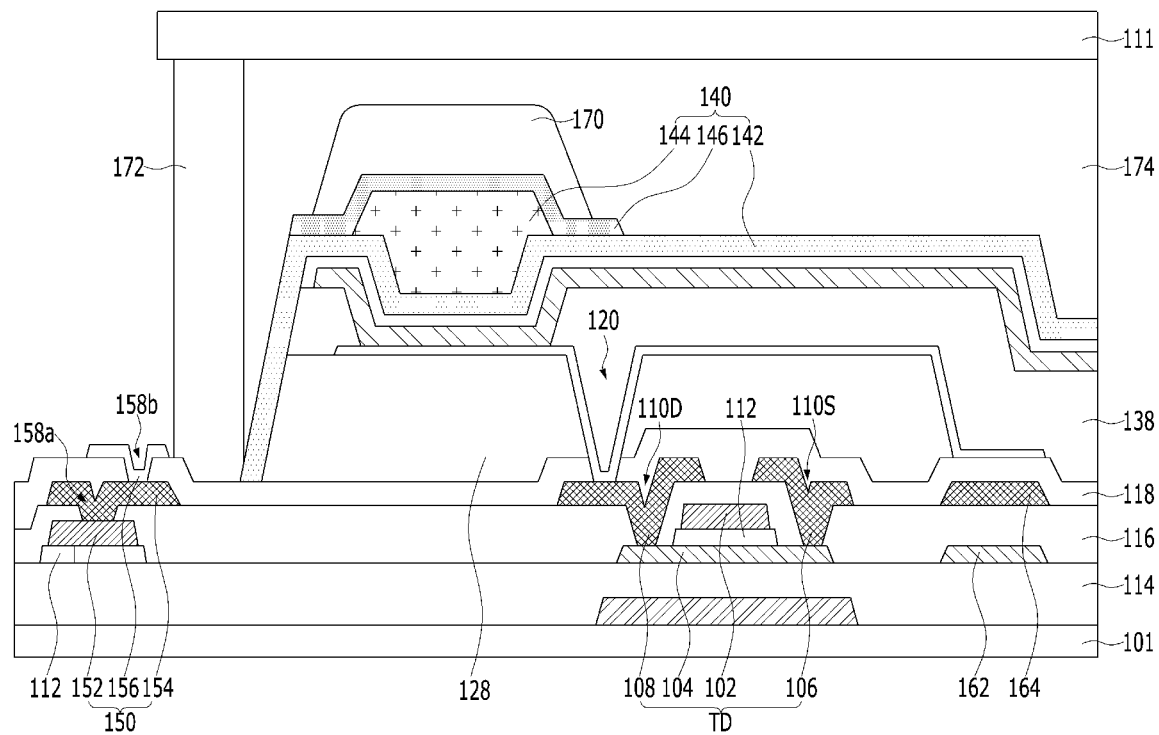
FIGS. 6A and 6B are sectional views showing a display device according to embodiments of the present disclosure including a second substrate and a dam.
Figure 6B:
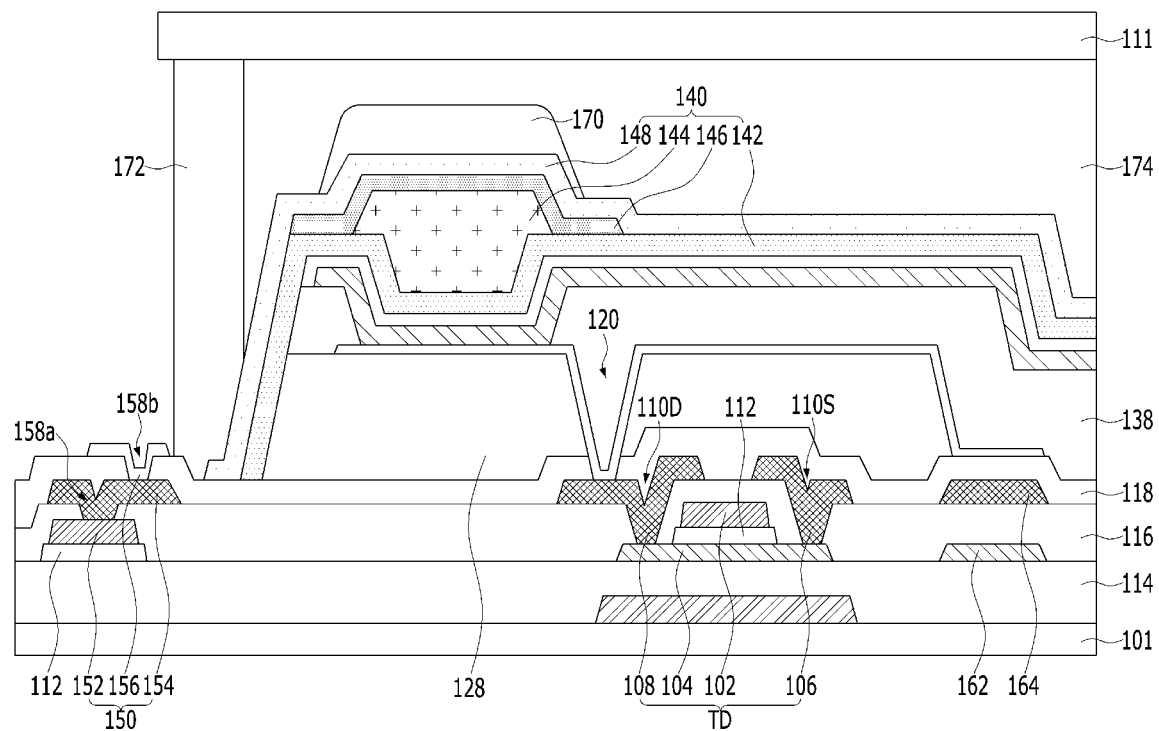

As shown in FIGS. 6A and 6B, the display device according to each of the first and second embodiments of the present disclosure described above may further include a second substrate 111. In this case, the encapsulation unit of the display device according to each of the first and second embodiments of the present disclosure may be applied not only to a small-sized (small-area) display device but also to a large-sized (large-area) display device.

The second substrate 111 is disposed so as to face the first substrate 101. The second substrate 111 is made of glass, polymer, or metal depending on the direction in which light is emitted by the organic light-emitting display device. For example, in the case in which the organic light-emitting display device is of a bottom emission type, the second substrate 111 is made of an opaque material such as metal. In the case in which the organic light-emitting display device is of a top emission type, the second substrate 111 is made of a transparent material such as glass. The second substrate 111 has a smaller area than the first substrate 101, whereby the pads 150 formed on the first substrate 101 are exposed.

The first and second substrates 101 and 111 are laminated using at least one of a filling layer 174 or a dam 172.

The filling layer 174 is disposed above the encapsulation unit 140 so as to fill the space between the first substrate 101 and the second substrate 111, and overlaps the organic light-emitting element 130. The filling layer 174 is made of a transparent material in order to prevent the luminance of the light emitted by the organic light-emitting element 130 from being reduced when the light is transmitted through the second substrate 111. For example, the filling layer 174 may be made of olefin or epoxy, which has adhesiveness, and may further include talc, calcium oxide (CaO), barium oxide (BaO), zeolite, or silicon oxide (SiO). The force of adhesion between the first substrate 101 and the second substrate 111 is increased by the filling layer 174 having adhesiveness.

The dam 172 is disposed in a plane so as to surround the active area AA, in which the organic light-emitting elements 130 are formed. The dam 172 may prevent the filling layer 174 from diffusing to the pad area, in which the pads 150 are disposed. The dam 172 has adhesiveness, and thus laminates the first substrate 101 and the second substrate 111 in a sealed state together with the filling layer 174. The dam 172 is made of an organic material including a photo- or thermosetting material, such as epoxy, acrylic, or silicon.

Figure 7:
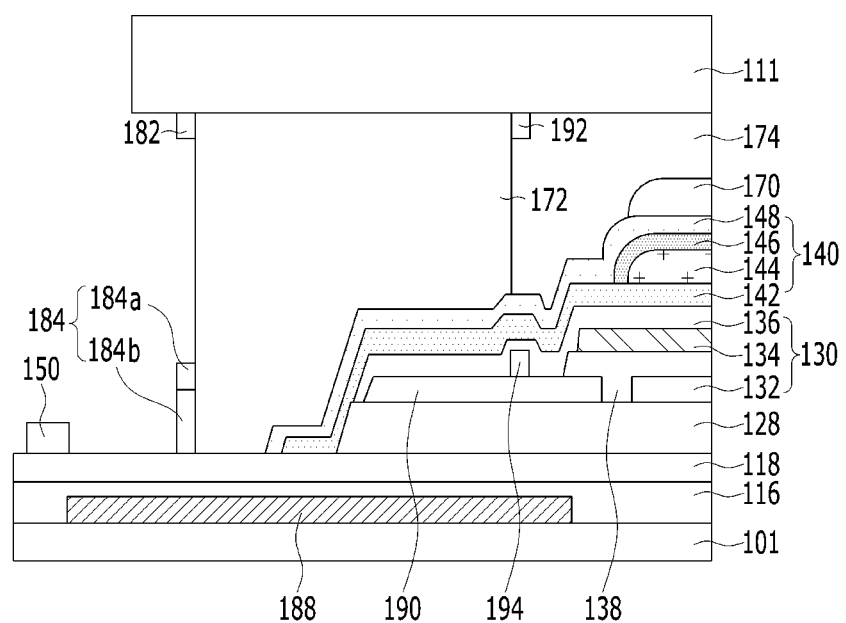
FIG. 7 is a sectional view showing, in detail, a dam area shown in FIGS. 6A and 6B according to an embodiment of the present disclosure.

Upper and lower outer dam banks 182 and 184 and upper and lower inner dam banks 192 and 194 are provided around the dam 172, as shown in FIG. 7.

The upper and lower inner dam banks 192 and 194 prevent the dam 172 from diffusing to the active area AA, in which the organic light-emitting elements 130 are disposed. The lower inner dam bank 194 is disposed on a shorting bar 190 overlapping a signal link 188. Here, the shorting bar 190 is made of the same material as the anode electrode 132, is disposed on the planarization layer 128, and is connected to the cathode electrode 136. The upper inner dam bank 192 is disposed on the second substrate 111.

The upper and lower outer dam banks 182 and 184 prevent the dam 172 from diffusing to the pad area PA, in which the pads 150 are disposed.

The lower outer dam bank 184 includes first and second lower outer dam banks 184a and 184b, which are sequentially stacked. The second lower outer dam bank 184b is formed on the passivation film 118, and is made of the same material as the planarization layer 128. The first lower outer dam bank 184a is formed on the second lower outer dam bank 184b, and is made of the same material as the lower inner dam bank 194.

The upper outer dam bank 182 is formed on the second substrate 111, and is made of the same material as the upper inner dam bank 192.

At least one of the upper outer dam bank 182, the lower outer dam bank 184, the upper inner dam bank 192, or the lower inner dam bank 194 is made of an organic dielectric material, such as an acrylic resin, an epoxy resin, a phenolic resin, a polyamide resin, or a polyimide resin.

Figure 8:
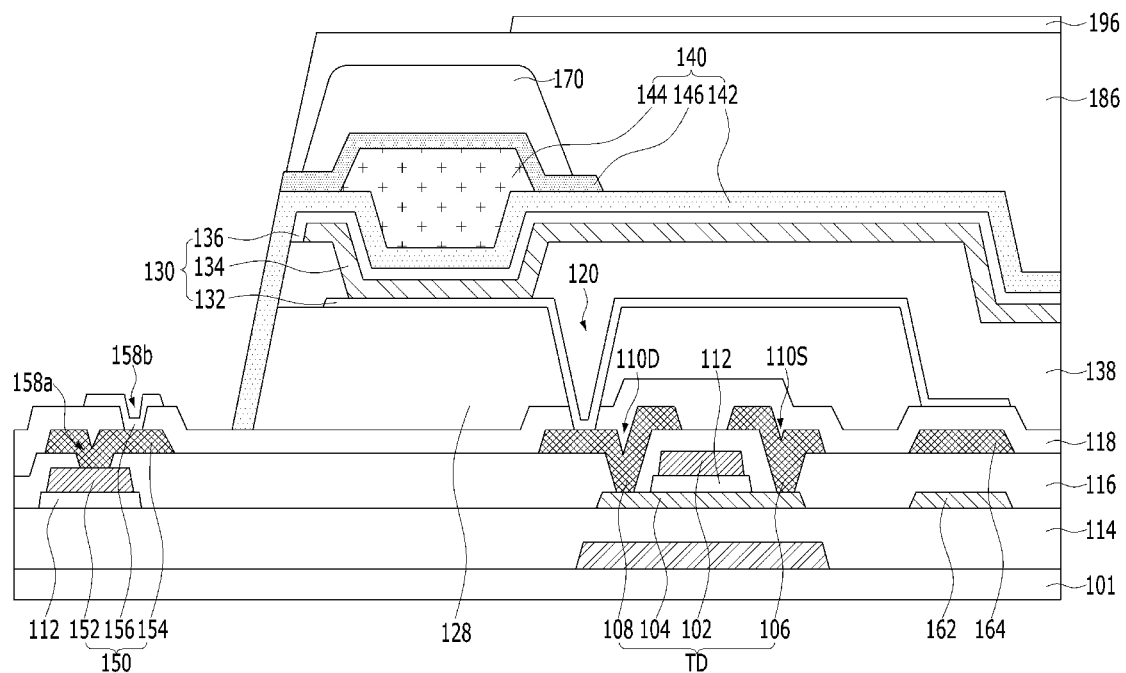
FIG. 8 is a sectional view showing a display device according to an embodiment of the present disclosure including a touch electrode.

Meanwhile, although the structure in which the color filter 170 is disposed on the encapsulation unit 140 has been described by way of example in the present disclosure, at least one of the color filter 170, a black matrix (not shown), a second planarization layer 186, or a touch electrode 196 may be disposed on the encapsulation unit 140, as shown in FIG. 8.

As is apparent from the above description, in the present disclosure, a plurality of divided organic encapsulation layers and a plurality of divided upper inorganic encapsulation layers are provided. Even when cracks or seams are formed in each of the organic encapsulation layer and the upper inorganic encapsulation layer of a specific subpixel due to foreign bodies or bending, therefore, it is possible to prevent the cracks or the seams from diffusing to an adjacent subpixel. Also, in the present disclosure, even when moisture, oxygen, or a developing solution used to form a color filter permeates into the subpixel in which cracks or seams are formed, the moisture, oxygen, or developing solution is prevented from diffusing to an adjacent subpixel, whereby the overall reliability and lifespan of a panel are improved.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A light-emitting display device comprising:
   a substrate;
   a plurality of pixels on the substrate, each pixel including a light-emitting element; and
   an encapsulation unit on the light-emitting element, the encapsulation unit including:
      a lower inorganic encapsulation layer disposed on the plurality of pixels to encapsulate the plurality of pixels, and disposed on the light-emitting element, a plurality of organic encapsulation layers on the lower inorganic encapsulation layer, the plurality of organic encapsulation layers spaced apart from one another, and a plurality of upper inorganic encapsulation layers disposed on the plurality of organic encapsulation layers, the plurality of upper inorganic encapsulation layers spaced apart from one another, and wherein an upper surface of the lower inorganic encapsulation layer contacts a lower surface of the plurality of upper inorganic encapsulation layers to minimize or prevent a permeation of external moisture or oxygen into the plurality of organic encapsulation layers disposed between the lower inorganic encapsulation layer and the plurality of upper inorganic encapsulation layers.

2. The light-emitting display device of claim 1, wherein each organic encapsulation layer of the plurality of organic encapsulation layers is disposed on a corresponding one of the plurality of pixels.

3. The light-emitting display device of claim 2,
wherein the light-emitting element of each pixel includes an anode electrode, an organic light-emitting layer, and a cathode electrode, and
wherein the organic encapsulation layer for each pixel overlaps with a portion of the anode electrode, a portion of the organic light-emitting layer, and a portion of the cathode electrode.

4. The light-emitting display device of claim 2, wherein each upper inorganic encapsulation layer of the plurality of upper inorganic encapsulation layers is disposed on a corresponding one of the plurality of organic encapsulation layers.

5. The light-emitting display device of claim 2, wherein each upper inorganic encapsulation layer is disposed on two or more corresponding organic encapsulation layers.

6. The light-emitting display device of claim 5,
wherein the two or more organic encapsulation layers are disposed across a row of pixels arranged along a first direction or a column of pixels arranged along a second direction, and
wherein the upper inorganic encapsulation layer for the two or more organic encapsulation layers extends in the first direction or the second direction to cover the two or more organic encapsulation layers.

7. The light-emitting display device of claim 1, wherein each organic encapsulation layer of the plurality of organic encapsulation layers is disposed on two or more pixels of the plurality of pixels.

8. The light-emitting display device of claim 7, wherein each upper inorganic encapsulation layer of the plurality of upper inorganic encapsulation layers is disposed on a corresponding organic encapsulation layer of the plurality of organic encapsulation layers, and is also disposed on the two or more pixels for the organic encapsulation layer.

9. The light-emitting display device of claim 8,
wherein the two or more pixels are a row of pixels arranged along a first direction or a column of pixels arranged along a second direction, and
wherein the organic encapsulation layer for the two or more pixels and the corresponding upper inorganic encapsulation layer for the organic encapsulation layer both extend in the first direction or the second direction to cover the two or more pixels.

10. The light-emitting display device of claim 1, further comprising:

a plurality of color filters disposed on the encapsulation units, each color filter in the plurality of color filters disposed above a corresponding one of the plurality of pixels.

11. The light-emitting display device of claim 1, further comprising:
a second upper inorganic encapsulation layer on the upper inorganic encapsulation layer, an area of the second inorganic encapsulation layer larger than an area of an upper inorganic encapsulation layer.

12. A light-emitting display device comprising:
a substrate;
a plurality of pixels on the substrate, each pixel including a light-emitting element;
a plurality of bank layers on the substrate, each bank layer disposed between a corresponding pair of pixels in the plurality of pixels; and
an encapsulation unit on the plurality of pixels, the encapsulation unit including:
a lower inorganic encapsulation layer disposed on the plurality of pixels to encapsulate the plurality of pixels, and disposed on the bank and the light-emitting element,
a plurality of organic encapsulation layers on the lower inorganic encapsulation layer, the plurality of organic encapsulation layers spaced apart from one another, and
a plurality of upper inorganic encapsulation layers disposed on the plurality of organic encapsulation layers, wherein each adjacent pair of upper inorganic encapsulation layers are spaced apart from one another to form a gap at a location of at least one of the plurality of bank layers, and
wherein an upper surface of the lower inorganic encapsulation layer contacts a lower surface of the plurality of upper inorganic encapsulation layers to minimize or prevent a permeation of external moisture or oxygen into the plurality of organic encapsulation layers disposed between the lower inorganic encapsulation layer and the plurality of upper inorganic encapsulation layers.

13. The light-emitting display device of claim 12, wherein each organic encapsulation layer of the plurality of organic encapsulation layers is disposed on a corresponding one of the plurality of pixels.

14. The light-emitting display device of claim 13,
wherein the light-emitting element of each pixel includes an anode electrode, an organic light-emitting layer, and a cathode electrode, and
wherein the organic encapsulation layer for each pixel overlaps with a portion of the anode electrode, a portion of the organic light-emitting layer, and a portion of the cathode electrode.

15. The light-emitting display device of claim 13, wherein each upper inorganic encapsulation layer of the plurality of upper inorganic encapsulation layers is disposed on a corresponding one of the plurality of organic encapsulation layers.

16. The light-emitting display device of claim 13, wherein each upper inorganic encapsulation layer is disposed on two or more corresponding organic encapsulation layers.

17. The light-emitting display device of claim 12, wherein each organic encapsulation layer of the plurality of organic encapsulation layers is disposed on two or more pixels of the plurality of pixels.

18. The light-emitting display device of claim 17, wherein each upper inorganic encapsulation layer of the plurality of upper inorganic encapsulation layers is disposed on a corresponding organic encapsulation layer of the plurality of organic encapsulation layers, and is also disposed on the two or more pixels for the organic encapsulation layer.

19. The light-emitting display device of claim 12, further comprising:
   a plurality of color filters disposed on the encapsulation units, each color filter in the plurality of color filters disposed above a corresponding one of the plurality of pixels.

20. The light-emitting display device of claim 12, further comprising:
   a second upper inorganic encapsulation layer on the upper inorganic encapsulation layer, an area of the second inorganic encapsulation layer larger than an area of an upper inorganic encapsulation layer.

* * * * *